(12) United States Patent
Chua et al.

(10) Patent No.: US 7,718,549 B2
(45) Date of Patent: May 18, 2010

(54) METHOD OF MAKING A POLYMER DEVICE

(75) Inventors: Lay-lay Chua, Singapore (SG); Peter Kian-Hoon Ho, Singapore (SG); Henning Sirringhaus, Cambridge (GB); Richard Henry Friend, Cambridge (GB)

(73) Assignee: Cambridge University Technical Services Limited, Cambridge (GB)

( * ) Notice: Subject to any disclaimer, the term of this patent is extended or adjusted under 35 U.S.C. 154(b) by 334 days.

(21) Appl. No.: 10/566,984

(22) PCT Filed: Aug. 11, 2004

(86) PCT No.: PCT/GB2004/003452

§ 371 (c)(1),
(2), (4) Date: Sep. 21, 2006

(87) PCT Pub. No.: WO2005/015982

PCT Pub. Date: Feb. 24, 2005

(65) Prior Publication Data

US 2007/0071881 A1    Mar. 29, 2007

(30) Foreign Application Priority Data

Aug. 11, 2003 (GB) .................................. 0318817.4

(51) Int. Cl.
*H01L 21/31* (2006.01)
*H01L 21/469* (2006.01)
(52) U.S. Cl. .................. 438/780; 438/99; 438/151; 438/199; 438/761; 257/E21.051; 257/E21.535
(58) Field of Classification Search ............... 438/99, 438/82, 780–782, FOR. 135, 151, 199, 761; 257/E21.049, E21.051, E21.535
See application file for complete search history.

(56) References Cited

U.S. PATENT DOCUMENTS 4,347,302 A    8/1982    Gotman (Continued)

FOREIGN PATENT DOCUMENTS

WO    WO 94/15368 A1    7/1994

(Continued)

OTHER PUBLICATIONS

Lei Huang, et al, "Computer Simulation on the Self-Assembly of Associating Polymers", Polymer, Elsevier Science Publishers B.V, GB, vol. 44 No. 6, Mar. 2003, pp. 1967-1972, XP004410286, ISSN: 0032-3861.

(Continued)

*Primary Examiner*—Matthew Smith
*Assistant Examiner*—Quovaunda Jefferson
(74) *Attorney, Agent, or Firm*—Sughrue Mion, PLLC (57) ABSTRACT

A method of making a transistor having first and second electrodes, a semiconductive layer, and a dielectric layer; said semiconductive layer comprising a semiconductive polymer and said dielectric layer comprising an insulating polymer; characterised in that said method comprises the steps of:
 (i) depositing on the first electrode a layer of a solution containing material for forming the semiconductive layer and material for forming the dielectric layer; and
 (ii) optionally curing the layer deposited in step (i); wherein, in step (i), the solvent drying time, the temperature of the first electrode and the weight ratio, of (material for forming the dielectric layer): (material for forming the semiconductive layer) in the solution are selected so that the material for forming the semiconductive layer and the material for forming the dielectric layer phase separate by self-organisation to form an interface between the material for forming the semiconductive layer and the material for forming the dielectric layer.

24 Claims, 5 Drawing Sheets

U.S. PATENT DOCUMENTS

| | | | |
|---|---|---|---|
| 5,472,502 A | 12/1995 | Batchelder | |
| 5,670,791 A | 9/1997 | Halls et al. | |
| 5,834,100 A * | 11/1998 | Marks et al. | 428/209 |
| 5,981,970 A * | 11/1999 | Dimitrakopoulos et al. | 257/40 |
| 6,197,663 B1 | 3/2001 | Chandross et al. | |
| 6,737,303 B2 * | 5/2004 | Cheng et al. | 438/150 |
| 7,029,945 B2 * | 4/2006 | Veres et al. | 438/99 |
| 7,037,767 B2 * | 5/2006 | Hirai | 438/149 |
| 2002/0084504 A1 * | 7/2002 | Narayan | 257/462 |
| 2003/0178626 A1 * | 9/2003 | Sugiyama et al. | 257/79 |
| 2004/0248338 A1 * | 12/2004 | Sirringhaus et al. | 438/99 |
| 2004/0253836 A1 * | 12/2004 | Sirringhaus et al. | 438/780 |

FOREIGN PATENT DOCUMENTS

| | | | |
|---|---|---|---|
| WO | WO 99/13692 | * | 3/1999 |

OTHER PUBLICATIONS

Hideaki Tanaka, et al, "Ordered Structure in Mixtures of a Block Copolymer and Homopolymers. 1. Solubilization of Low Molecular Weight Homopolymers", Macromolecules, American Chemical Society, vol. 24, No. 1, Jan. 1991 pp. 240-251, XP002319295, Easton, US.

G. Dreezen, et al, "Nano-Structured Polymer Blends: Phase Structure, Crystallisation Behaviour and Semi-Crystalline Morphology of Phase Separated Binary Blends of Poly(Ethylene Oxide) and Poly(Ether Sulphone)", Polymer, Elsevier Science Publishers B. V, GB, vol. 41, No. 4, Feb. 2000, pp. 1395-1407, XP004244129, ISSN: 0032-3861.

Michael Redecker, et al, "High Mobility Hole Transport Fluorene-Triarylamine Copolymers" Advanced Materials, VCH Verlagsgesellschaft, Weinheim, DE, vol. 11, No. 3, Feb. 11, 1999, pp. 241-246, XP000803283, ISSN: 0935-9648.

* cited by examiner

METHOD OF MAKING A POLYMER DEVICE

The present invention concerns a new method for making a polymer device and a polymer device per se that is obtainable by the method. In particular, the present invention relates to a method for making a polymer transistor and, specifically a field-effect transistor, sensor or phototransistor that operates through field-induced charge densities. The present invention further relates to a method for making electronic or optoelectronic devices comprising a polymer transistor.

Transistors, and specifically field-effect transistors (FETs), are three-terminal devices, which comprise a source contact, a drain contact, and a gate contact. A semiconductive layer bridges the source and drain contacts, and is itself spaced from the gate contact by an insulating layer called the gate dielectric. In polymer transistors, the semiconductive layer is fabricated from a semiconductive polymer, typically a n-conjugated organic polymer. According to known methods, this layer may be deposited in the device by a precursor route or directly by solution-processing.

A voltage is applied across the source contact and the drain contact. Further, in a field effect transistor, a voltage is applied to the gate contact. This voltage creates a field, which alters the current-voltage characteristics of the semiconductive layer lying directly under the gate dielectric by causing accumulation or depletion of charge carriers there. This in turn modulates the rate at which charges pass from the source to the drain contact for a given source-drain voltage.

In the case of a phototransistor, the gate contact is transparent to light. This allows photons to pass through the gate and dielectric layer into the semiconductive layer below. The photons can generate hole-electron pairs, which split and contribute to current flowing between the source and drain, thereby modulating the source-drain conductivity.

A polymer sensor is a particular type of transistor where a sensor material is in contact with the dielectric gate, the dielectric layer or the semiconductive layer, for example. The sensor responds to the presence of an analyte by selectively adsorbing it, for example, and then inducing a change in the channel conductivity through an electrostatic field effect, for example.

The polymer FET sensor comprises three terminals with the analyte solution directly contacting the thin gate dielectric to form the gate contact which gates the source-drain conductivity. The polymer FET sensor is therefore structurally distinct from the FET.

Vertical transistors are characterised by a vertical spacing of source and drain electrodes bridged by a semiconductor channel that runs substantially perpendicular to the substrate plane. This is distinct from the more commonly encountered lateral transistors, in which the source and drain electrodes are spaced by a semiconducting channel that runs substantially parallel to the substrate plane.

The primary advantage of the vertical configuration is that short channel lengths (i.e. a source-drain spacing of less than 1 micron) can be readily fabricated. This is achieved by controlling the deposited thickness of the spacer layer between the source and drain electrodes without resorting to electron-beam or other difficult types of lithography. For example, the thickness of the spacer layer can be controlled so as to have a thickness in the range of from 10,000 nm to sub-100 nm. Parameters that control the thickness include solution concentration (for all solution deposition methods), spin speed (for spin-casting), drop volume (for drop casting), or viscosity (for flexography). In general, for spin casting, the thickness of the deposited spacer layer is proportional to the solution concentration and inversely proportional to the square root of the spin speed. This can be easily determined by spinning trials. For ink-jet printing, the thickness of the spacer layer is proportional to the drop volume and solution concentration.

This makes vertical transistors an attractive configuration for use in organic FETs. This is particularly because in organic FET's, charge-carrier mobility tends to be moderate, typically in the range ($10^{-1}$-$10^{-4}$ cm$^2$/Vs) and, consequently, reducing the channel length becomes the only means for gaining speed and for reducing drain and gate operational voltages.

However, in providing a thin spacer layer in a vertical transistor in order to provide a short channel length, a number of practical problems may be encountered. Chief amongst these is the fabrication of an ultrathin gate-dielectric layer that is of a high quality.

Fabricating an ultrathin defect-free dielectric layer that also has a high-quality interface with the adjacent semiconductive layer is one of the greatest challenges for polymer transistors. The dielectric layer should show high dielectric breakdown strength, very low electrical conductivity, very low interface and bulk trapping of carriers, and good stability.

This challenge has been met for Si CMOS (Complementary Metal-Oxide-Semiconductor) FET technologies through the discovery that thermally-grown $SiO_2$ forms a nearly atomically perfect interface having very low density of interface states with the underlying Si. $SiO_2$ is robust, has high film integrity and has sufficiently high dielectric breakdown strength for practical applications. (See for example, Handbook of Semiconductor Manufacturing Technology, Y. Nishi and R. Doering Eds, Marcel Dekker N.Y. 2000, Ch 7, pp. 163-184).

For polymer transistors (particularly FET technologies), while diagnostic devices prepared on bottom-gate configuration with thermal $SiO_2$/Si substrate have shown good FET characteristics, there is a pressing need to develop alternative practical gate dielectric systems for commercial applications, such as electronic papers, printed logic circuits and radiofrequency tracking tags (RF tags). Such gate dielectric layers preferably are easy to fabricate conformally on a variety of substrates in both top-gate and bottom-gate configurations. They also preferably exhibit high flexure strength, significant thermal stability (including low thermal degradation rate, and high softening temperature) and environmental resistance (such as low moisture uptake).

In addition, they desirably should be formable into an ultrathin, conformal, pinhole-free film that presents a high-quality interface with the semiconductive layer (polymer). In this regard the interface desirably should be molecularly abrupt and molecularly smooth, have a low interface trap density, and also be chemically stable.

Based on electrostatic and other considerations, the optimum ratio of gate-dielectric thickness (d) to source-drain channel length (L) is between 1/10 and 1/50. For a target source-drain channel length of 2 microns or 1 micron, there is thus strong incentive to scale the gate dielectric thickness to ultrathin proportions i.e. to below 100 nm, particularly to between 20 and 100 nm. Roughly, the voltage required to operate the FET (gate voltage and drain voltage) scales linearly with d and L. Therefore, as mentioned above, scaling down d and L together makes possible lower-voltage and faster FET operation, which is important for advantageous exploitation of the technology.

Although there are numerous insulating polymer systems known, for example from Properties of Polymers, D. W. van Krevelen, Elsevier (Amsterdam, 1990) Ch 11, pp. 321-342, the search for a gate-dielectric that can fulfil all of the above requirements is still not trivial. Furthermore, as a first step, the gate dielectric polymer must be compatible with the overall designated processing scheme of polymer FETs. For example, its formation must not destroy earlier formed layer integrities, while it itself has to survive subsequent solvent and thermal processing (if any).

Presently, technology for forming a gate dielectric layer centres on a generic method of first-forming the semiconductive layer and depositing the gate-dielectric layer thereon, or vice versa. In other words, the two layers are deposited independently.

In the above generic method, the first layer has the top interface formed in and exposed to air. The duration of exposure of the interface to air depends on the subsequent process steps. Although the deposition of the next layer can be time-linked to the first, there typically still will be significant exposure of the first interface to the ambient. This interface becomes the critical active channel of the device after depositing the next layer. Forming or exposing this interface to the ambient atmosphere may have detrimental effects for the performance of the device. In this regard, impurities, chain defects and chain ends tend to segregate to the first interface that is formed in air, owing to the high surface energy there and the associated higher surface chain segmental mobility. When impurities, chain ends or other defects segregate to the interface, which subsequently becomes the active channel, the conduction of the field-induced charge-carriers will be affected. In particular, the impurities can trap the carriers and reduce their mobility, or react with the charge carriers and irreversibly degrade the interface. Also some impurities can further be adsorbed from the atmosphere (such as moisture, oxygen, environmental amines, particulate contaminants etc) and can accumulate at the surface. When the FET structure is completed by subsequent deposition of the dielectric or semiconductor layer, such accumulated defects can interfere with the conduction of the induced charge-carriers at that interface. In particular, trapping of the charge carriers at defect or impurity sites can lead to degradation of the field-effect mobility.

Despite possible problems with the afore-mentioned method, experimentation for forming ultrathin (less than 100 nm) gate dielectric layers and for forming a high-quality semiconductive/dielectric interface has been focussed firmly on optimising the semiconductive material and the dielectric material per se and has not been focussed on the method.

Several articles reporting an unorthodox approach for formation of the dielectric and semiconducting layers have been published recently. This approach put forward materials for forming a self-assembled dielectric layer and, separately, materials for forming a self-assembled semiconducting layer. These articles were:

J. H. Schön, H Meng and Z. Bao "Self-assembled monolayer organic field-effect transistors" Nature 413 (2001) 713: (retracted subsequently in Nature 422 (2003) 92);

J. H. Schön, H. Meng and Z. Bao "Field-effect modulation of the conductance of single molecules" Science 294 (2001) 2138 (retracted subsequently in Science 298 (2002) 961);

J. H. Schön and Z. Bao "Nanoscale organic transistors based on self-assembled monolayers" Applied Physics Letters 80 (2002) 847: (retracted subsequently in Applied Physics Letters 82 (2003) 1313; and J. H. Schön, H. Meng and Z. Bao "Self-assembled monolayer transistors" Advanced Materials 14 (2002) 323: (retracted subsequently in Advanced Materials 15 (2003) 478).

However as noted above, these papers in fact were later retracted from the literature as a result of an independent review, which found that data in fact had been fabricated in these papers. Furthermore, despite attempts by numerous groups worldwide to reproduce the teaching of these documents, no working device has ever been verified. As such, the organic FET's disclosed in these papers are non-enabled.

One further article published by Hendrik Schön and Zhenan Bao was published during the same period as the aforementioned retracted papers. This paper is J. H. Schön and Z. Bao "Organic insulator/semiconductor heterostructure monolayer transistors" Applied Physics Letters 80 (2002) 332. This paper purports to disclose an organic FET that is made using a self-assembled monolayer of a dielectric molecule that is subsequently derivatised with a semiconductor moiety at the gate electrode surface. This paper reports similar data to those discredited in the aforementioned retracted papers. This paper therefore does not enable an organic FET that is made using a self-assembled monolayer of a molecule that is subsequently derivatised with a semiconductor moiety.

The above-referenced articles in fact disclose nothing more than the concept of "self-assembly". However, the concept of "self-assembly" was already known in this art, for example from J. Collet, O. Tharaud, A. Chapoton and D. Vuillaume "Low-voltage 30 nm channel length organic transistor with a self-assembled monolayer as gate insulator" Applied Physics Letters 76 (2000) 1941. This document discloses the self-assembly of dielectric molecules to form the gate dielectric in an organic transistor.

Furthermore, in polymer science generally, vertical phase separation of a blend of polymers to give polymer-polymer interfaces is known. However, typically, this interface is non-planar and is not molecularly abrupt. This is because clean polymer-polymer phase separation is hindered by sluggish kinetics owing to entanglement of the polymer chains.

Also, a diblock polymer that is able to phase separate to provide an interface is known, for example, from H. Tanaka, H. Hasegawa and T. Hashimoto, "Ordered structure in mixtures of a block copolymer and homopolymers: 1. Solubility of low molecular weight homopolymers", Macromolecules 24 (1991) pp. 240-251. This paper is concerned specifically with studying the morphology of micro domains formed by mixtures of a poly(styrene-b-iso-prene) diblock copolymer with the corresponding homopolymers. The paper reports two kinds of phase transitions. One of these is the phase transition associated with phase separation of block chains of the diblock polymer into micro domains. The paper simply reports a purely academic study for the sole purpose of further investigating polystyrene/polyisoprene polymer physics. No industrial application of the reported systems is disclosed since this is not the motivation for this paper. In particular, there is no mention of a device structure, and specifically there is no mention of a transistor or a method for making the same. Further, the polymer mixtures disclosed in this paper would not even be suitable for use in a transistor since they do not have the required functional capabilities and, therefore, their particular behaviour is of no relevance to the field of the present application.

In view of the above, there still remains a need to provide further polymer dielectric systems for use in transistors. Preferably the new polymer dielectric systems will be formable into an ultrathin film that can present a high-quality interface with a semiconductive layer (polymer). Further preferably, the new polymer dielectric systems will be easy to fabricate on a variety of substrates and will exhibit high flexure strength and environmental resistance. Also, preferably, they will have low bulk electrical conductivity, high dielectric breakdown strength and high thermal stability.

In at least partially addressing the above need, the present inventors have unexpectedly found a new method for forming a semiconductive layer and a dielectric layer. Instead, of using the standard protocol involving independent deposition as described above, the present inventors have succeeded in devising a new method involving depositing the two layers in a single step. As such, the two layers are deposited simultaneously. The new method exploits the unexpected properties of two bulk phases contained in a single solution.

As such, in a first aspect of the present invention there is provided a method of making a transistor having first and second electrodes, a semiconductive layer, and a dielectric layer; said semiconductive layer comprising a semiconductive polymer and said dielectric layer comprising an insulating polymer; characterised in that said method comprises the steps of:

(i) depositing on the first electrode a layer of a solution containing material for forming the semiconductive layer and material for forming the dielectric layer; and (ii) optionally curing the layer deposited in step (i); wherein, in step (i), the solvent drying time, the temperature of the first electrode and the weight ratio of (material for forming the dielectric layer): (material for forming the semiconductive layer) in the solution are selected so that the material for forming the semiconductive layer and the material for forming the dielectric layer phase separate by self-organisation to form an interface between the material for forming the semiconductive layer and the material for forming the dielectric layer.

Further, in a second aspect of the present invention there is provided a transistor obtainable by the method defined in the first aspect of the present invention.

Still further, in a third aspect of the present invention there is provided an electronic or optoelectronic device, such as an RF tag, an electronic paper, a chemical sensor, a logic circuit, an amplifier, or a driver circuit, comprising a transistor as defined in the second aspect of the present invention.

A fourth aspect of the present invention provides a method of making an electronic or optoelectronic device comprising a transistor having first and second electrodes, a semiconductive layer, and a dielectric layer; said semiconductive layer comprising a semiconductive polymer and said dielectric layer comprising an insulating polymer; characterised in that said method comprises the steps of:

(i) depositing on the first electrode a layer of a solution containing material for forming the semiconductive layer and material for forming the dielectric layer; and (ii) optionally curing the layer deposited in step (i); wherein, in step (i), the solvent drying time, the temperature of the first electrode and the weight ratio of (material for forming the dielectric layer): (material for forming the semiconductive layer) in the solution are selected so that the material for forming the semiconductive layer and the material for forming the dielectric layer phase separate by self-organisation to form an interface between the material for forming the semiconductive layer and the material for forming the dielectric layer.

A fifth aspect of the present invention provides an electronic or optoelectronic device obtainable by the method defined in the fourth aspect of the present invention.

A sixth aspect of the present invention provides apparatus for controlling solvent drying time during deposition on a substrate of a solution containing material for forming one or more polymer layers in an electronic or optoelectronic device, said apparatus comprising a plate for carrying the substrate; characterised in that the plate is positioned inside an enclosure, said enclosure having a solvent vapour inlet port and an outlet port.

A seventh aspect of the present invention provides the use of apparatus as defined in the sixth aspect of the present invention in a method for making a transistor.

An eighth aspect of the present invention provides the use of apparatus as defined in the sixth aspect of the present invention in a method for making an electronic or optoelectronic device.

The method according to the first aspect of the present invention may be contrasted with any prior art method insofar as, in the present invention, the interface forms by self-organisation of the material for forming the dielectric layer and the material for forming the semiconductive layer. The material self-organises by lamellar phase separation upon appropriate control of the processing conditions. The present invention relates to self-organisation of two bulk phases (for example polymer-polymer, monomer-polymer, monomer-oligomer or diblock polymers), as distinct from self-assembly of single molecules or sequential chemical derivatisation of a self-assembled molecule. The lamellar phase separation takes place on such a small scale that a very thin dielectric layer and a very thin semiconductive layer are obtainable. In this regard, it is very important to note that the phase separation is lamellar. That is to say, a statistical distribution of dielectric material and semiconductive material throughout the layer deposited in step (i) is not ultimately obtained. Instead, the material for forming the dielectric layer and the material for forming the semiconductive layer cleanly phase separate into a bilayer structure with a single interface separating the two layers.

The present method is efficient and is compatible with both lateral and vertical transistors, as the bilayer formed is conformal over existing topography on the substrate surface. Further, the present method allows the transistor to be readily scaled down to smaller dimensions. The fact that the semiconductor channel and the dielectric may be deposited simultaneously in a single-step in the present method confers the additional advantage of not needing subsequent pattern definition on excess removal steps.

A further advantage of the present method is that the interface is formed in a single step without exposing it to the ambient. Thus, the problems discussed above relating to defects and impurities at the interface substantially are avoided.

In accordance with the present invention, a clean semiconductive-dielectric bilayer structure can be spontaneously formed. The inventors surprising discovered that the resultant semiconductive-dielectric interface is planar and molecularly abrupt and is of good enough quality to support practical field-effect mobilities. The interface is not rough or diffused. By "molecularly abrupt", it is meant that the interfacial root-mean-square roughness separating the two domains and measured for spatial wavelengths less than 1 micron is less than 2 nm.

In fact, characteristics of a transistor as referred to in the first aspect of the present invention indicate that the charge-carrier mobility at the interface is comparable to that of a benchmark reference interface with hexamethyldisilazane-functionalised $SiO_2$-on-Si.

Preferably the charge-carrier mobility at the interface is as high as possible. Presently, typical values obtainable with the present invention are in the range $10^{-6}$-$10^{-2}$ cm$^2$/V s.

The quality of the interface is determined largely by the kinetics of the phase separation in the initial stages. This is indirectly controlled by the weight or volume ratio of the material for forming the dielectric layer to the material for forming the semiconductorlayer. Also, the weight ratio of the material for forming the dielectric layer to material for forming the semiconductive layer directly determines the respective final thickness of the dielectric layer and the semiconductive layer.

The present inventors have discovered that further important determinants afford further means of control of the phase separation. These determinants are the rate of solvent evaporation, which is affected to some extent by the temperature of the first electrode. Fast solvent evaporation leads to rapid quenching into the two-phase region of the ternary phase diagram (i.e. fast phase separation trajectory speed) and gives rise to lateral micron-scale phase-separated domains. When the solvent evaporation rate is too slow, the solvent-rich bilayers forming have sufficient time to destabilise and rearrange to give lateral globular phases that are thermodynamically more stable. The trajectory speed of the phase separation therefore dictates the interface quality. This can be measured through roughness indicators or fast-Fourier-transform power spectral density measurements from atomic force microscopy (AFM), after stripping off the top layer. The critical lateral length scale to measure this interface fluctuation is the short wavelength regime (1-500 nm).

When deposition in step (i) is carried out in an enclosed chamber, the control of solvent evaporation rate may be achieved by controlling the solvent vapour pressure in the chamber. The solvent vapour pressure can be regulated by appropriate mixing of the solvent vapour with a carrier gas (for example, nitrogen) using mass flow controllers. An example of apparatus suitable for appropriately mixing the solvent vapour with a carrier gas is described in relation to the sixth aspect of the present invention.

Alternatively, the solvent vapour pressure can be indirectly regulated by co-spinning with a measured volume of the solvent placed on a separate spinner plate. Co-spinning means spinning the polymer solution onto the substrate on one deck while simultaneously spinning the pure solvent on a lower deck, all inside an enclosed chamber. As the solvent from the lower deck is spun off, it evaporates into the enclosed space to set up a solvent vapour pressure.

It will be readily understood by one skilled in this art that the temperature of the first electrode will affect the solvent drying time. In this regard the temperature of the first electrode is inversely proportional to the solvent drying time such that when the first electrode is heated, the solvent drying time will decrease.

Referring to the first aspect of the present invention, a single solution containing both the material for forming the semiconductive layer and the material for forming the dielectric layer is used in step (i). The selection of the weight ratio of (material for forming the dielectric layer):(material for forming the semiconductive layer) in the solution in combination with selection of the solvent drying time and temperature of the first electrode are essential for achieving phase separation to form the interface. It is particularly important to note in this regard that hitherto there has been no effective method for controlling the solvent drying time during deposition of a solution when making a polymer electronic or optoelectronic device. Controlling solvent drying time has been provided only by the present invention for the purpose of enabling phase separation when material for forming the dielectric layer and material for forming the semiconductive layer is used at a desirable weight ratio.

With regard to the solvent drying time, preferably this is in the range of from 0.1 to 100 s. However, it will be appreciated that the optimal solvent drying time will be dependent on the ratio of (material for forming the dielectric layer):(material for forming the semiconductive layer) in the solution and also the nature of the materials.

"Solvent drying time" is the time taken for all of the solvent to evaporate to form a solid film. When using the apparatus according to the sixth aspect of the present invention, the solvent drying time can be measured from the time the spinner starts running to the time when the interference colour of the film stops changing. The point when the interference colour of the film stops changing can be judged by the naked eye or by simple instrumentation, such as an interferometer, and is generally used by those skilled in this art to determine when a solid film has formed.

Preferably, the weight ratio of (material for forming the dielectric layer):(material for forming the semiconductive layer) is in the range of from 0.5 to 2. However, it will be appreciated that the optimal weight ratio will depend on kinetic factors and also the desired final thickness of the dielectric layer and semiconductive layer.

Knowing the importance of solvent drying time, temperature of first electrode, and weight ratio, one can optimise these parameters by routine experimentation in order to achieve the advantageous lamellar phase separation that characterises the method according to the first aspect of the present invention.

In a first embodiment of the method according to the first aspect of the present invention, the material for forming the dielectric layer is mixed with the material for forming the semiconductive layer in the single solution that is deposited in step (i). The solution may further contain a catalyst for curing.

In the first embodiment, the material for forming the dielectric layer and the material for forming the semiconductive layer macro-phase separate to form the bilayer structure separated by an abrupt interface.

In this first embodiment, typically, the material for forming the semiconductive layer will comprise the semiconductive polymer and/or oligomers for forming the semiconductive polymer. Where the solution contains oligomers for forming the semiconductive polymer, curing in step (ii) is essential in order for the oligomers to polymerise to form a semiconductive polymer.

In this first embodiment of the first aspect of the present invention, the material for forming the dielectric layer typically will comprise an insulating polymer, or oligomers and/or monomers for forming the insulating polymer. Where the material for forming the dielectric layer comprises oligomers and/or monomers for forming the insulating polymer, curing in step (ii) is essential in order for the monomers and/or oligomers to polymerise to form the insulating polymer.

Where the material for forming the dielectric layer comprises oligomers, each oligomer preferably has a molecular weight of less than 3000.

In the first embodiment, in one aspect, it is preferred that the material for forming the semiconductive layer comprises a semiconductive polymer and that the material for forming the dielectric layer comprises monomers for forming the insulating polymer. In another aspect, it is preferred that the material for forming the semiconductive layer comprises a semiconductive polymer and that the material for forming the dielectric layer comprises an insulating polymer. The semiconductive polymer and the monomers for forming the insulating polymer; or the semiconductive polymer and the insulating polymer macro-phase separate in order to form the bilayer structure that is characteristic of the present invention.

Where the method includes a curing step, in any embodiment of the present method, self-organisation of the material for forming the dielectric layer and the material for forming the semiconductive layer occurs prior to any curing step.

In a second embodiment of the first aspect of the present invention, the material for forming the semiconductive layer and the dielectric layer comprises a diblock polymer. The diblock polymer comprises two "blocks", one "block" ultimately having a semiconductor function and the other ultimately having a dielectric function. This diblock polymer is in solution in step (i). The solution may further contain a catalyst for curing, where desired. After deposition of the solution in step (i) the "blocks" in the diblock polymer microphase separate to provide two lamellar macro domains. Phase separation of a diblock polymer having a semiconductor block and a dielectric block hitherto was completely unknown. Certainly, phase separation of such a diblock polymer was unknown in a method for making a transistor.

In the second embodiment of the first aspect of the present invention, it will be appreciated that, in the finished device, the semiconductive layer will comprise a semiconductive polymer that is in the form of a semiconductive block. Further, the dielectric layer will comprise an insulating polymer that is in the form of an insulating block. In other words, in the second embodiment, the semiconductive polymer and the insulating polymer will be comprised in the diblock polymer.

A generic formula of a diblock polymer according to the second embodiment of the first aspect of the present invention is:

$S_{n-Dm}$ where $S_n$ comprises the semiconductor block and $D_m$ comprises the dielectric block. The $S_n$ block may include only one type of repeat unit (S) or may include more than one different type of repeat unit ($S^1$, $S^2$, $S^3$ ... etc). In this regard, the $S_n$ block may include, for example, 2, 3 or more than 3 different repeat units. These different repeat units may be arranged randomly, alternately or in a block configuration within the $S_n$ block. Where the semiconductor block includes more than one different S repeat unit, n is the total number of repeat units in the block. In the example shown below, n is 7:

$S^1$-$S^1$-$S^1$-$S^2$-$S^2$-$S^2$-$S^2$-$D_m$

Similarly, the $D_m$ block may comprise one or more than one different type of repeat unit, for example 2, 3 or more different repeat units ($D^1$, $D^2$, $D^3$ ... etc). Again, the different "D" repeat units may be arranged in a random, alternating, or block configuration within the $D_m$ block.

The number of repeat units (n and m) in the semiconductive block and the dielectric block is selected so that the semiconductor block and dielectric block phase separate.

Further, the nature of the "S" repeat units and the "D" repeat units and their arrangement within the semiconductor block and the dielectric block are selected so that the semiconductor block and the dielectric block phase separate to give the two lamellar macro domains of semiconductor and dielectric materials separated by an abrupt interface.

The lengthscale of the lamellar micro-phase separation (i.e., the thickness $L_S$ and $L_D$ of the respective S and D lamellae) is governed by the respective radius of gyration ($R_g$) of the respective blocks. $R_g$ is proportional to $a*\sqrt{N}$ where N is the number of Kuhn segments each of length a of each block (N is proportional to the molecular weight of the block). In the strong segregation limit, L is approximately proportional to $R_g(N)^{1/6}$. The proportional constant depends on how strongly the blocks are separated. The preferred values of $L_D$ and $L_S$ are given by the same design rule considerations as described above. By way of example, for an L value of 30 nm, the molecular weight of the block should be around 30,000-60,000 g/mol depending on the stiffness of the block. Preferably (but not necessarily) each of the blocks is nearly monodispersed, i.e. of nearly constant number of repeat units. Furthermore, the interface root-mean-square roughness should preferably be less than 2 nm, for spatial wavelengths shorter than 1 micron. This is in order that strong segregation of the two functional blocks to give a sharp boundary between the lamellae occurs. This is readily achieved for many different $S_n$ blocks and $D_m$ blocks by routine experimentation.

In this embodiment, the material for forming the semiconductive layer comprises the semiconductor block. Further, the material for forming the dielectric layer comprises the dielectric block.

In this second embodiment, any required or desired catalyst would be a separate component that is mixed with the diblock polymer in the solution.

The solution may also further contain homopolymer(s) of one or more of the different the repeat unit(s) ("S" and "D") of one or both of the blocks.

In either the first or second embodiment of the first aspect of the present invention, the material for forming the semiconductive layer preferably comprises one or more aromatic or heteroaromatic structural units. As mentioned above, in the first embodiment of the first aspect of the present invention, the material for forming the semiconductive layer may comprise a polymer or oligomers mixed with the material for forming the dielectric layer or, in the second embodiment, may comprise a block in a diblock polymer. It is preferred that the one or more aromatic or heteroaromatic units independently are selected from the group consisting of fluorenedyil, phenylene, phenylene vinylene, triarylamine, thiophenediyl, thiophene, oxadiazole and benzothiadiazole.

It is preferred that the final semiconductive polymer be partially, substantially or even fully conjugated.

Optionally, the final semiconductive polymer may be crosslinked. Where the semiconductive polymer is crosslinked, the material for forming the semiconductive layer should comprise crosslinkable groups. Further, the material for forming the semiconductive layer should be cured in step (ii) so that crosslinking occurs.

Where the material for forming the semiconductive layer comprises a semiconductive polymer, this is crosslinked in a curing step after phase-separation. Alternatively, where crosslinking is not required, the semiconductive polymer in the material for forming the semiconductive layer may be the final semiconductive polymer.

The material for forming the semiconductive layer may be liquid crystalline.

In order for the insulating polymer to be formed, the material for forming the dielectric layer preferably comprises insulating structural units such as hydrocarbons including styrene and derivatives thereof, dimethylsiloxane, bisbenzocyclobutene-divinyldisiloxane, perfluoroalkylene, perfluoroarylene ether, siloxane, acrylates, main-chain esters, amides, and isocyanates. As mentioned above, the material for forming the dielectric layer, in the first embodiment, may comprise monomers, oligomers and/or an insulating polymer and, in the second embodiment, may comprise a block in a diblock polymer.

For both the first and second embodiments, the material for forming dielectric layer preferably comprises one or more units having a low cohesive-energy density. Without wishing to be bound by theory, it is thought that the unique properties of the one or more low cohesive-energy-density structural units are particularly useful for achieving self-organised lamellar phase separation according to the present invention. In particular, it is thought that the unique properties of the one or more low cohesive-energy-density structure units are particularly desirable for forming a planar and molecularly abrupt interface. Also, it is thought that these structural units can impart desirable device characteristics on a transistor that is made in accordance with the first aspect of the present invention. The low cohesive-energy-density structural units preferably are in combination with other suitable groups such as aromatic rings, or alkyl chains.

Semiconductor oligomers and polymers tend to have large cohesive energy densities on account of the n-n* interaction.

Therefore, when the material for forming the dielectric layer comprises one or more units having a low cohesive-energy density, the difference in cohesive energy densities between the material for forming the semiconductor layer and the material for forming the dielectric layer ensures that the two components have an unfavourable mutual interaction. This provides the driving force for phase separation. Traditionally, this interaction is captured by the interaction parameter $\chi$ given by the square of the difference of the solubility parameters of the two components, which in turn are simply the square roots of the two cohesive-energy densities. All of these parameters may be estimated following procedures given in Properties of Polymers, D. W. van Krevelen, Elsevier (Amsterdam, 1990), and so guidance for the selection of materials is provided.

For a monomer (oligomer)-polymer-solvent system, the interaction $\chi$ between the monomer (oligomer) and polymer desirably exceeds approximately 1 in order for phase separation to occur in accordance with preferred aspects of the present invention. For a polymer-polymer-solvent system or for the diblock polymer system, because of the high molecular weight involved, the interaction $\chi$ between the two polymers or blocks desirably exceeds approximately 0.05, depending on the molecular weights of the components, for the desired phase separation to occur.

Cohesive energy density refers to the energy required to separate out the structural units against their Van der Waals interaction. This property is extensively discussed for example in Properties of Polymers. Their Correlation with Chemical Structure: Their Numerical Estimation and Prediction from Additive Group Contributions, D. W. van Krevelen, (Elsevier, N.Y. 1990) Ch. 7 pp. 189, and Ch. 8 pp. 227.

In order to achieve good phase separation, it is preferred that the backbone of the insulating polymer comprises one or more low cohesive-energy-density structural units. The insulating polymer may further comprise side groups comprising one or more low cohesive-energy-density structural units.

Structural units that fall within this category will be well known to the skilled person. Preferably, the low-cohesive-energy-density structural units have a cohesive energy density of less than 300 J/cm$^3$. More preferably, the low-cohesive-energy-density structural units have a cohesive energy density of less than 200 J/cm$^3$. Also preferably, the low-cohesive-energy-density structural units have a cohesive energy density of greater than 100 J/cm$^3$. Most preferably, the low-cohesive-energy-density structural units have a cohesive energy density in the range of from 100 to 200 J/cm$^3$.

Preferably, the one or more units having a low cohesive-energy density are selected from the group consisting of siloxane, perfluoroalkyl, perfluoroarylene ether, and perfluoroalkylene ether. Such units are expected to contribute to the formation of a planar and molecularly abrupt interface during phase separation.

An example of a structural unit that possess such a property is a siloxane having a $Si(R)_2$—O—$Si(R)_2$ group where each R independently comprises a hydrocarbon. The hydrocarbon may be saturated or unsaturated. Preferred R groups include alkyl, aryl, cycloalkyl, alkoxyl, and aryloxyl groups. A preferred alkyl group is methyl. A preferred aryl group is phenyl. In one preferred embodiment both R are methyl. In another preferred embodiment, both R are phenyl. A further example is a fluorinated phenyl ether —$C_6F_4$—O—$C_6F_4$—. Other examples can be obtained by group-contribution estimation according to the formulae given in the above-referenced book.

By way of example, $Si(CH_3)_2$—O—$Si(CH_3)_2$ has a cohesive energy density of about 150 J/cm$^3$.

Preferably, the final insulating polymer comprises a plurality of low cohesive-energy-density structural units.

In this regard, preferably, the content of low cohesive-energy-density structural units in the final insulating polymer is in the range of from 25 to 95% by weight.

Preferably, the insulating polymer comprises a plurality of $Si(R)_2$—O—$Si(R)_2$ units. In this regard, preferably, the content of $Si(R)_2$—O—$Si(R)_2$ units in the polymer is in the range of from 25 to 95% by weight.

In one embodiment, one or more $Si(R)_2$—O—$Si(R)_2$ units in the insulating polymer may be comprised in one or more side chains to the polymer backbone. In this embodiment, the backbone may be any polymer fragment that is stable at the curing temperature used to form the insulating polymer (typically at least 150° C.). Suitable polymer backbones may comprise aromatic, alkyl, and/or cycloalkyl structural units.

It is preferred that there are one or more low cohesive-energy-density structural units in the polymer backbone. This is preferred because this has been found to improve thermal stability, film forming properties, and chemical and environmental stability; and to lower electrical conductivity, and trapping of charge carriers.

Where the polymer backbone comprises a low cohesive-energy-density structural unit (preferably a repeat unit comprising a low cohesive-energy-density structural unit), the polymer backbone may include other repeat units. Examples of other possible repeat units include aromatic, alkyl, and cycloalkyl units.

It may be desirable for the material for forming the dielectric layer to comprise crosslinkable groups. In this regard, where the material for forming the dielectric layer comprises an insulating polymer, this may be crosslinked in a curing step after phase-separation. Alternatively, where crosslinking is not required, the insulating polymer in the material for forming the dielectric layer may be the final insulating polymer.

Where the final insulating polymer is crosslinked, preferably, the insulating polymer includes substantially no residual —OH leaving groups. More preferably, the insulating polymer includes substantially no —OH groups (including residual —OH leaving groups).

Where the final insulating polymer is crosslinked, preferably, the final insulating polymer does not include more than 1% by weight —OH groups. More preferably, the insulating polymer contains less than 0.1% by weight —OH groups.

If the final insulating polymer includes residual —OH groups then this indicates that —OH leaving groups were present in the reactant material. If —OH leaving groups are present in the reactant material, this may impart high surface tension that may mean that a solution containing the reactant material will have insufficiently good film forming properties. Further, the presence of —OH leaving groups in the reactant material typically will lead to some loss of $H_2O$ during curing. This may lead to disadvantageous shrinkage of the film during curing.

As such, preferably the material for forming the dielectric layer substantially does not include any —OH leaving groups. Still more preferably, the material substantially does not include any —OH groups.

A low level of —OH groups (including —OH leaving groups) can be tolerated in the reactant material. In this regard, preferably the material for forming the dielectric layer does not include greater than 10% by weight —OH groups. If the material for forming the dielectric layer includes 10% by weight or less of —OH groups then, after curing, the insulating polymer will include substantially no residual —OH leaving groups. More preferably, the material for forming the dielectric layer contains less than 5%, even more preferably less than 0.5% by weight —OH groups.

Preferably, the crosslinking group where present in the final insulating polymer is derivable from a crosslinkable group in the material for forming the dielectric layer that can be cured without the loss of a leaving group. Structural units that show this behaviour include benzocyclobutene, divinylsiloxane, hydrosiloxane, epoxy, oxetane, and acrylate units. Suitable mechanisms under which such a crosslinkable group may be cured include an addition reaction such as the Diels-Alder reaction. An example of a system that would undergo the Diels-Alder reaction is a crosslinkable group including benzocyclobutene and alkene. An example of a further system that would undergo an addition reaction is a crosslinkable group including hydrosilane and alkene. The advantage of crosslinkable groups that can be cured without the loss of a leaving group is that problems relating to shrinkage of the film during curing are avoided.

In view of the above, it will be appreciated that it is preferred that the crosslinkable group in the reactant material for forming the present insulating polymer includes an alkene.

A preferable crosslinkable group comprises benzocyclobutene (BCB) and alkene. As such, a preferable crosslinking group in the insulating polymer comprises 2,3-disubstituted tetrahydronapthalene.

A preferred final insulating polymer comprises the general formula:

where X is a crosslinking group, L comprises a low cohesive-energy-density structural unit and R' is a hydrocarbon, $0.01 < a < 0.75$, $0.25 < b < 0.95$, $0 < c < (1-a-b)$. Where present, R' will provide further integrity and structure for the polymer chain.

A more preferred final insulating polymer according to this invention comprises a repeat unit having the general formula:

where X and L are as defined above.

Even more preferably, the insulating polymer according to this invention comprises a repeat unit having the formula:

where X and R are as defined above.

A particularly preferred monomer for forming the insulating polymer has the general formula:

where L comprises a low cohesive-energy-density structural unit as defined above and each Y independently is a crosslinkable group as defined above. As mentioned previously, the crosslinkable group typically comprises a hydrocarbon and preferably comprises an alkene. As also mentioned above, L preferably comprises $Si(R)_2$—O—$Si(R)_2$.

Also, preferably, the material for forming the dielectric layer has a surface tension in the range of from 15 to 35 dyn/cm.

The surface tension of a monomer or oligomer for forming the dielectric layer can be tested by the following methods:

(a) Film-forming ability. A film of the required thickness (for example, 100 nm) is made and examined for film uniformity using profilometry, interferometry or ellipsometry, and hole defect density using optical microscope or atomic force microscope. The film uniformity expressed as a fraction of film thickness variation across a 1-inch substrate with 3-mm perimeter exclusion must be better than 2%. No defects should be found in an observation field of $0.01$ mm$^2$. This is an indirect method to test the suitability of the surface tension of the material.

(b) Degree of planarisation. A 1-μm film of the monomer or oligomer or precursor polymer when coated over isolated 0.5-μm-tall isolated metal lines with linewidth less than 10-μm should give a degree of planarisation better than 90%. This is not test for surface tension per se, but one of a number of possible materials screening test.

(c) Pendant drop method. A droplet of the monomer or oligomer or precursor polymer is formed at the end of a flat-end syringe. The droplet shape is imaged by a visual system and the surface tension can be calculated using standard equations described for example in Physical chemistry of Surfaces, A. W. Adamson, (John Wiley&Sons, N.Y. 1990). The surface tension should be 15-35 dyn/cm.

Preferably, the final insulating polymer per se has low-conductivity, preferably lower than $10^{-16}$ S/cm, and high dielectric breakdown strength, preferably higher than 0.5 MV/cm, more preferably higher than 3 MV/cm.

Dielectric breakdown strength can be tested in a standard electrode/dielectric film/electrode structure.

Preferably, the final insulating polymer has a static dielectric constant of at least 2.2. More preferably the static dielectric constant is as high as possible. Reasonably the static dielectric constant will be in the range of from 2.2 to 6. This can be measured using a capacitance meter on the above electrode/dielectric film/electrode structure. (The BCB-based polymer has a static dielectric constant of 2.65).

The transistor that is made in accordance with the first aspect of the present invention may be in top-gate or bottom-gate configuration. In either case, it is necessary to provide a first electrode prior to step (i) onto which the solution may be deposited.

Where the transistor is in top-gate configuration, it is especially desirable that the material for forming the dielectric layer comprises the one or more units having a low cohesive-energy density as discussed above. This is preferred so that the low cohesive-energy density units segregate to the top of the deposited layer, away from the first-formed electrode. This segregation is driven by both kinetics and thermodynamics.

Particularly in the case of a transistor in bottom-gate configuration, the material for forming the dielectric layer advantageously may comprise one or more units having a high affinity for the first-formed electrode. As such, during phase separation, the one or more units having high affinity for the first-formed electrode will segregate to the first electrode so that the dielectric layer forms on the first-formed electrode. High affinity in this context means to have a specific interaction between the two components.

Two general methods for achieving high affinity between the first formed electrode and the material for forming the dielectric layer may be mentioned. Firstly, certain atoms or groups that have a high affinity for the first formed electrode may be included in the material for making the dielectric layer. Alternatively, the first formed electrode may be surface treated prior to deposition in step (i) in order to assist the high affinity. For example, the first formed electrode may be surface treated with a self-assembled monolayer, which includes atoms or groups having high affinity for the first formed electrode and also atoms or groups having high affinity for the material for forming the dielectric layer. The surface treatment may further include an oxygen plasma treatment.

Three preferred systems having "high affinity" may be mentioned: (1) sulphur atoms (in the form of thiol, thiol ester, thiol carbonyl moieties) with gold, copper and silver electrodes; (2) acid groups (sulfonic, phosphonic and carboxylic) with aluminium electrodes; (3) ionic groups (sulfonate, phosphonate, carboxylate, ammonium etc) with conducting polymer electrodes including PEDT:PSS.

Taking gold as an example of a first-formed electrode, where a bottom-gate configuration is required, one may incorporate sulphur or amine units in the material for forming the dielectric layer. Alternatively one may surface treat the gold with thiol or amine monolayers bearing a group on the other terminus that attracts the dielectric material. By way of example, attached styrene segments attract a polystyrene-based dielectric material, and attached siloxane segments attract a siloxane-based dielectric material.

Referring to the thickness of the dielectric layer and the semiconductor layer after step (ii), preferably the thickness of the dielectric layer is below 400 nm.

Preferably, for top-gate-and-bottom-source-drain or bottom-gate-and-top-source-drain configurations, the semiconductive layer has a thickness less than $\frac{1}{30}$ of the channel length more preferably, less than $\frac{1}{60}$ of the channel length. For top-gate-and-top-source-drain or bottom-gate-and-bottom-source-drain configurations, the semiconductive layer has a thickness in the range of 300 nm to 10 nm, more preferably, 100 nm to 10 nm.

As a consequence of an advantageously thin gate dielectric layer, the operational voltage of the transistor is correspondingly reduced. As such, the operational voltage of the transistor as referred to in the first aspect of the present invention is preferably in the range 30 to less than 5 volts, more preferably in the range 20 to less than 5 volts, most preferably less than 5 volts.

Preferably, deposition in step (i) is by inkjet printing, spin casting or other suitable printing method.

In the present method as described in any embodiment above, advantageously, the solvent should be compatible with both the semiconductor and dielectric materials. Possible solvents include aromatic hydrocarbons (including toluene, xylene, mesitylene, isodurene, tetrahydronaphthalene) and halogenated solvents (including chloroform, chlorobenzene, dichlorobenzene, trichlorobenzene) and mildly polar ether solvents (including tetrahydrofurane, cyclohexanone).

Referring to step (ii), as mentioned above, the systems used in the present invention desirably may incorporate crosslinkable groups. Where crosslinkable groups are present, in order to form the final crosslinked layer, the method must include a curing step. The systems used in the second embodiment (i.e. the diblock polymers) do not need to have crosslinkable groups incorporated and so do not need to be cured, although they may benefit from the incorporation of such crosslinking groups.

Preferably curing is by thermal curing or by exposure to the appropriate radiation, depending on the crosslinkable groups that are present. This will be known to the person skilled in the art.

Suitably, curing in relation to any embodiment of the present method may be done by, either slow thermal processing or, preferably, by rapid thermal processing (RTP) or by laser anneal.

Rapid thermal processing (RTP), sometimes also known as rapid thermal annealing (RTA), in the context of inorganic semiconductor device manufacturing is well known and is described for example in Handbook of Semiconductor Manufacturing Technology, Y. Nishi and R. Doering Eds, Marcel Dekker N.Y. 2000, Ch 9, pp. 201.

The optimum conditions for curing in step (ii) can be determined by anyone skilled in the art using test structures and infrared spectrometry.

Typically, an inert atmosphere such as a nitrogen atmosphere with oxygen present at a level of less than 5 ppm is used during curing.

Optionally, the present method may include a further step (iii) whereby the cured layer from step (ii) is annealed in an appropriate solvent vapour to planarise the interface and improve field-effect conduction further. This may be achieved by exposing the bilayer structure to the solvent vapour in temperature-controlled conditions.

The present inventors have found that short-wavelength (1-500 nm) interface roughness can be further improved (post-crosslinking where the dielectric layer is crosslinked) by solvent-vapour anneal. Without wishing to be bound by theory, the inventors believe that this is because both the capillary wave roughness and the intrinsic profile of the semiconductor-dielectric interface are annealed out. This can be done for example using the apparatus according to the sixth aspect of the present invention. The progress of improvement can be monitored by roughness measurements for example using AFM as described above.

When the root-mean-square roughness measured for spatial wavelengths less than 1 micron is below a certain value, typically in the region of 2 nm, good field-effect conduction has been observed according to the first embodiment of the first aspect of the invention According to the present invention, the gate leakage current density of a transistor as referred to in the first aspect of the present invention or according to the second aspect of the present invention can be less than 5 nA/mm$^2$ at a gate electric field strength of 3 MV/cm. This is similar or superior to SiO$_2$. The dielectric breakdown strength advantageously may be greater than 3 MV/cm. Both of these properties are vastly superior to those of the previously investigated dielectric polymers mentioned above.

Preferably, the transistor that is made in the first aspect of the present invention is a field-effect transistor, a phototransistor or a polymer sensor.

The transistor that is the subject of the second aspect of the present invention may be as described anywhere above in relation to the first aspect of the present invention.

Generally, referring to the fourth aspect of the present invention, the method will comprise a method according to the first aspect of the present invention. As such, all aspects and embodiments as described above in relation to the first aspect of the present invention also are applicable to the fourth aspect of the present invention.

The fifth aspect of the present invention provides an electronic or optoelectronic device. Examples of electronic or optoelectronic devices according to the fourth aspect of the present invention include an RF tag, electronic paper, chemical sensor, logic circuit, amplifier, and driver circuit.

The sixth aspect of the present invention provides apparatus for controlling solvent drying time during solution processing. Solvent drying time has not been controlled in any prior art methods and, as such, such apparatus hitherto is unknown.

Preferably, the apparatus has a first inlet port and a second inlet port. Typically, the first inlet port will be a solvent vapour inlet port and the second inlet port will be a gas carrier inlet port. Preferably, the apparatus also includes one or more grids for maintaining even gas flow. The one or more grids are positioned inside the enclosure. Preferably, the apparatus comprises two grids where the grids are positioned perpendicular to the inlet flow and outlet flow. The plate optionally has means for controlling the temperature of the first electrode (substrate).

The apparatus according to the sixth aspect of the present invention is suitable for use in making a transistor and, further, an electronic or optoelectronic device. The transistor and electronic or optoelectronic device may be as defined in any aspect of the present invention.

The vapour pressure inside the chamber is controlled by the inlet and outlet ports. The solvent vapour is premixed with a carrier gas to give the desired solvent vapour pressure. To increase drying time (i.e. to reduce the phase separation speed), the solvent vapour pressure is selected to be higher. The solvent vapour-carrier gas mixture is admitted into the enclosure and flows across the substrate surface and through the chamber. In this way, the optimum vapour pressure for the desired drying time can be determined experimentally. Furthermore, the substrate can be optionally heated or cooled to control the phase separation.

The present invention now will be described in more detail with reference to the attached figures in which.

Example 1

Polymer—Monomer System

As illustrated in FIG. 1B, a glass substrate 1 is prepatterned with 15-20-nm thick gold (with 3-nm-thick chromium adhesion layer) source-drain interdigited array 2, 3. Channel length is 3 micron, channel width 10 nm. The substrate is then cleaned by oxygen plasma (pressure of oxygen, 450 mbar; power 200 W; time, 10 min) in a barrier-type Plasmaline etcher, followed by Millipore water, then isopropanol rinse, and nitrogen blow-off. Hexamethyldisilazane is spun onto the substrate at 900 rpm, 30s, and then the substrate is baked in air on a hotplate for 2 min at 120° C.

To decrease the strong surface preference of gold for the gate dielectric (owing to the high surface energy of clean gold), the gold surface is treated with octadecylthiol in phenylcyclohexane (0.5 wt/v %) for 1 h at room temperature and then washed with acetone, isopropanol and dried under nitrogen blow-off.

Figure 1:
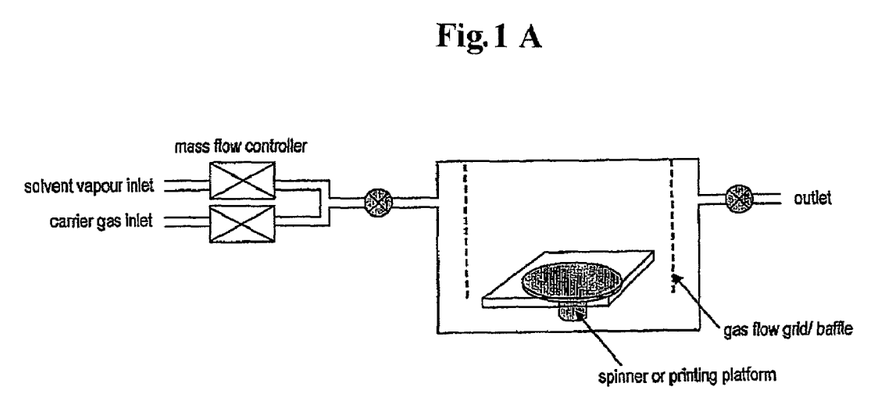
FIG. 1A shows one embodiment of apparatus according to the sixth aspect of the present invention and FIG. 1B shows the gate dielectric device that results from the method using the apparatus of FIG. 1A.

A solution of TFB-DVS-BCB-mesitylene (3:2:100 by weight) is then spin-cast onto the substrate at 1600 rpm in a controlled airflow environment (see Note 1 and FIG. 1) to give a drying time of 30s. The resultant film 4 comprises 60-nm-thick DVS-BCB 4b overlying 80-nm-thick TFB 4a.

(TFB=poly[(9,9-dioctylfluorene-2,7-diyl)-alt-(phenylene-(N-(p-2-butylphenyl)imino-phenylene)]; DVS-BCB=divinyltetra-methylsiloxane bis(benzocyclobutene).

The bilayer is then rapid-thermal cured for 9 s on a hotplate at 290° C. under nitrogen.

Optionally, the bilayer structure is then annealed with spinning at 1600 rpm in controlled flow environment with saturated mesitylene vapour for 25 s.

A PEDT:PSS top-gate electrode 5 is then printed onto the top dielectric surface in air, dried at 80° C., and then transferred to a nitrogen box to bake for 2 min on a hotplate at 160° C.

The polystyrene sulfonic acid-enriched form of the commercial solution (Baytron P™ from HC Starch of Leverkusen, Germany) with a PSS-to-PEDT ratio of 10-16 is very strongly acidic and has a high concentration of sulfonic acid groups that react with charge carriers and are suspected to interfere with device stability. This source of acidity was removed by ion-exchanging H$^+$ with the hexadecyltrimethylammonium surfactant-ion $CH_3(CH_2)_{15}N(CH_3)_3^+$ in a dialysis chamber. The exchange was completed to 99.9% (pH and FTIR analysis). The resultant PEDT:PSSR (R=$C_{16}NMe_3$) material has a lower surface tension than PEDT:PSSH and shows better wetting and adhesion on BCB polymer, with only a marginal drop of conductivity. Furthermore, it is less brittle on account of the long-chain surfactant ion. This makes PEDT:PSSR particularly attractive for use in plastic electronics. Furthermore we found that PEDT:PSSR can reaction-bond to the surface of the BCB polymer at a 160° C. (hotplate, under $N_2$) in 2 min. The overlayer cannot be completely removed by washing in water. The interface formed shows considerable strength and cannot be delaminated by scotch tape.

Figure 2:
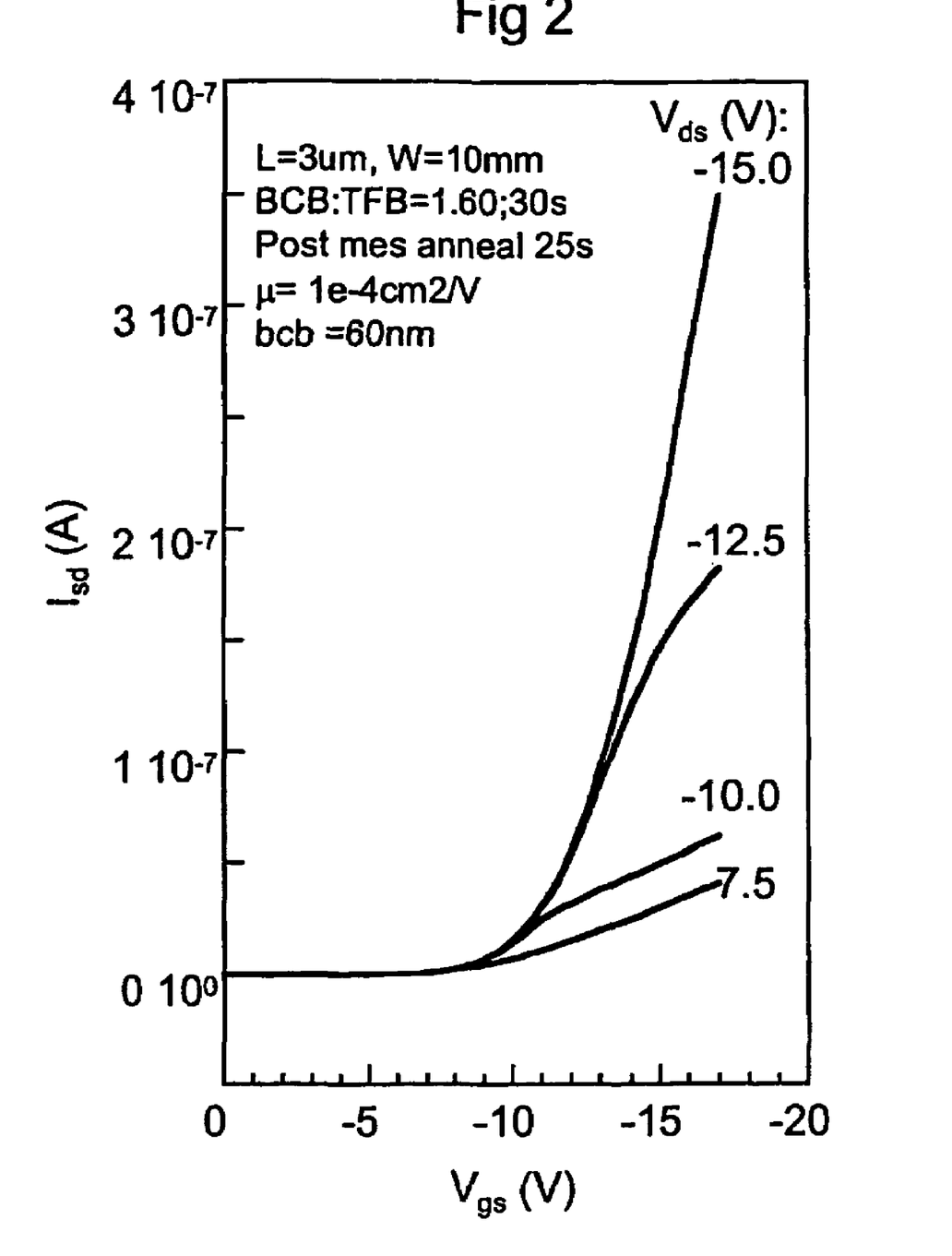
FIG. 2 shows the transfer characteristics of the gate-dielectric device of Example 1.
Figure 3:
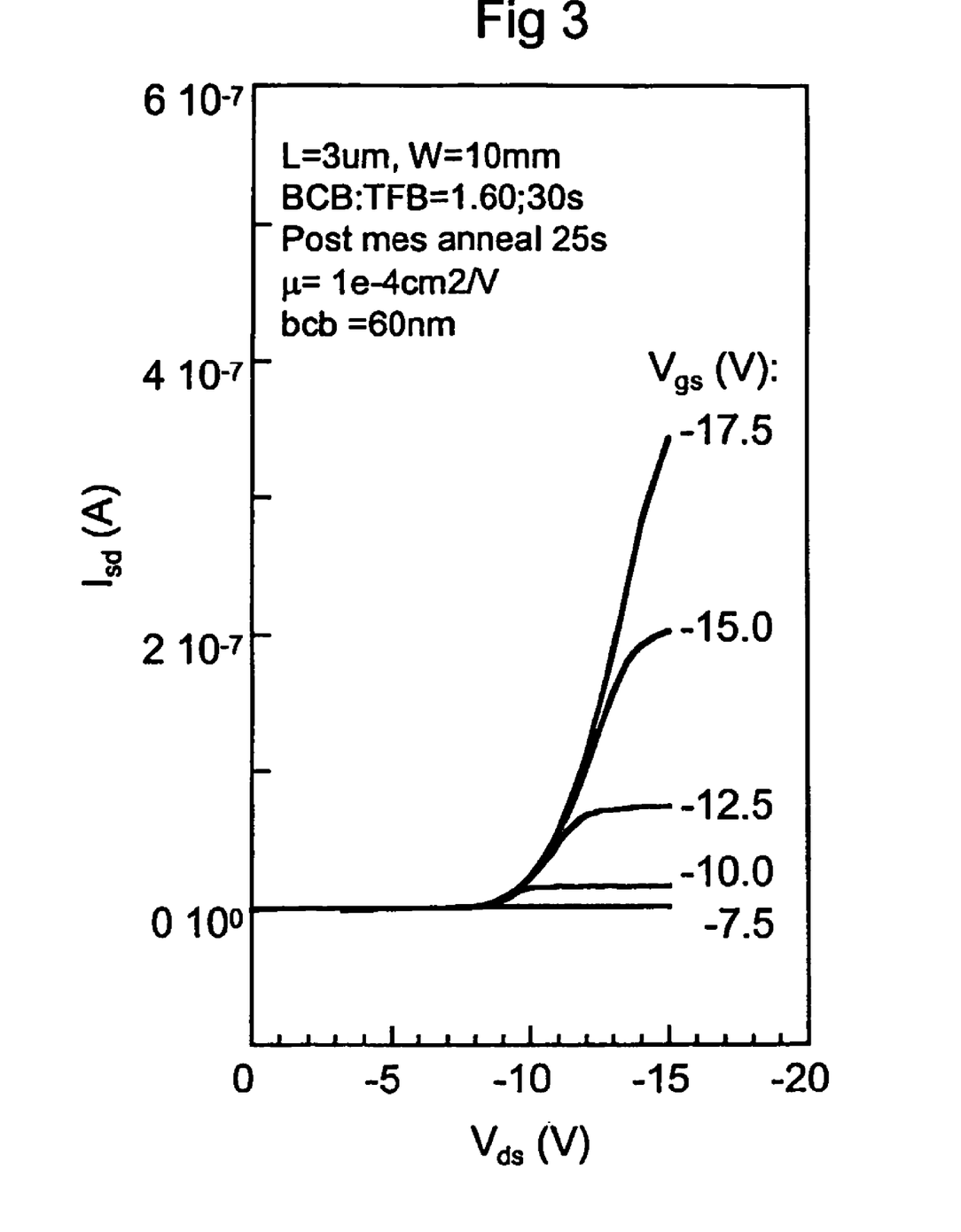
FIG. 3 shows the output characteristics of the device according to Example 1.

The transfer characteristics of this 60-nm self-organised gate-dielectric device are given in FIG. 2. The threshold gate voltage ($V_{th}$) is ca. 10 volts. This is largely limited by traces of ionic impurities in the TFB semiconductor, which accumulates to the interface, as evidenced by similar behaviour on separate $SiO_2$/Si bottom gate devices. A strong turn-on of the channel conductivity is found when the gate voltage ($V_{gs}$) is increased a few volts above this threshold. An "on" source, drain current of ca. few hundred nanoAmperes is obtained for a drain voltage ($V_{ds}$) of −15 volts, which is −6 volts over its threshold. A ($V_{gs}$-$V_{th}$) of −7.5 volts is obtained. On-off ratio is better than 100. The measured gate current leakage ($I_g$) is typically better than 10 nA, which is remarkably small, considering that the electric field strength in the BCB-based polymer gate dielectric at this point is ca. 3 MV/cm. The FET mobility extracted by traditional equations from the $I_{sd}$-$V_{gs}$ slope in the linear regime is n×$10^{-4}$ cm$^2$/V s, where n is in the range of from 1 to 5. This is comparable to best values obtained on traditional bottom-gate $SiO_2$/Si gate. The output characteristics are shown in FIG. 3. Good saturation behaviour of $I_{sd}$ is found, indicating that the device is well behaved.

Figure 4:
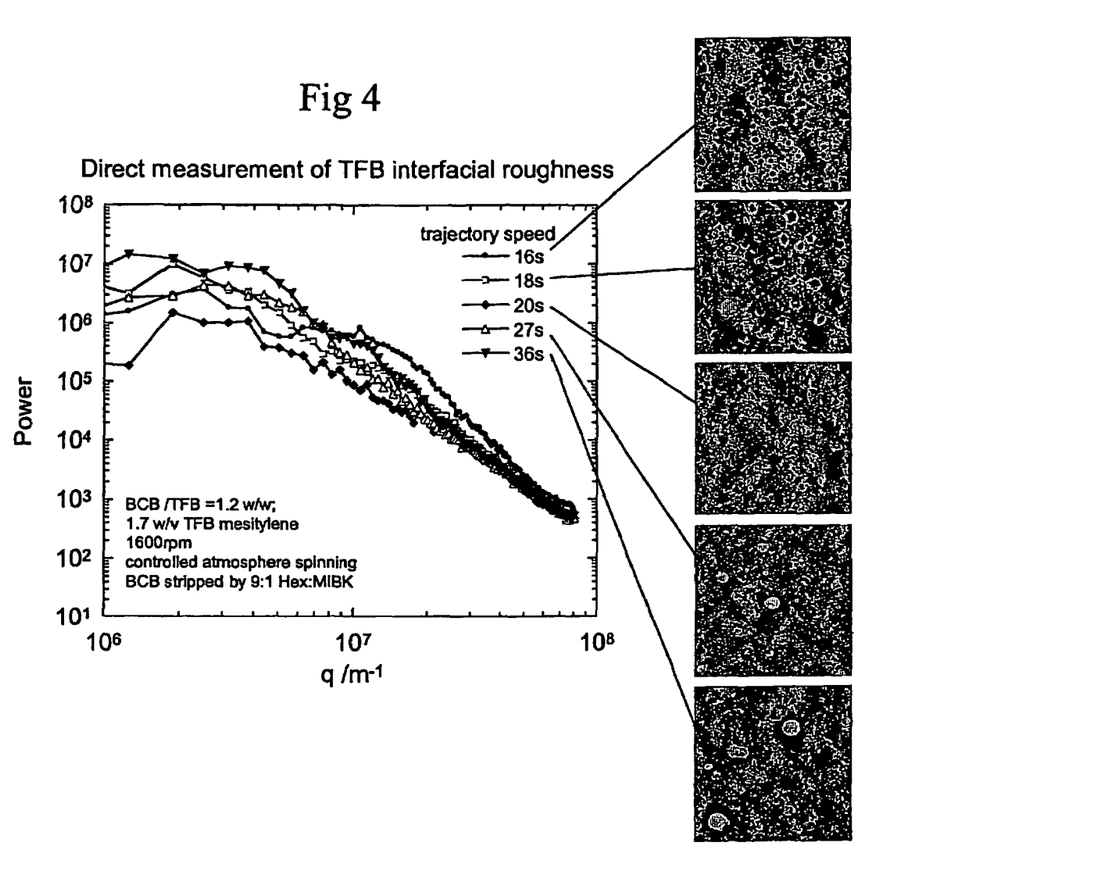
FIG. 4 shows the bilayer structure formed using different trajectory speeds.

At the optimum trajectory speed, clean bilayer structures are formed as shown in FIG. 4. In this way, the optimal conditions for phase separation can be determined for any materials system.

EXAMPLE 2

Polymer—Polymer System (a) Poly(dimethylsiloxane, divinyl-terminated) ("PDMS", viscosity, 850-1150 cSt; Aldrich) is dissolved into mesitylene (12.7 w/v %) together with poly(dimethylsiloxane-co-methylhydrosiloxane) ("PMHS", viscosity, 12 cSt; 50-55% dimethylsiloxane; Aldrich) (1.3-2 w/v %). This solution is then mixed with a mesitylene solution of TFB (1.8 w/v %) to give a ratio of PDMS-to-TFB ratio of 1-1.8, and spin-cast with control of temperature and phase-separation trajectory speed as described in Example 1. A bilayer structure of PDMS-PMHS over TFB is obtained when optimised. The bilayer is then annealed at 210° C. for 2 min on a hotplate under nitrogen to effect crosslinking of the PDMS with the PMHS to give the crosslinked dielectric layer.

(b) Poly(dimethylsiloxane-co-diphenylsiloxane, divinyl-terminated) ("PDM-co-DPS", 15% diphenylsiloxane; viscosity, 1000 cSt; Aldrich) is dissolved into mesitylene (12.7 w/v %) together with poly(dimethylsiloxane-co-methylhydrosiloxane) ("PMHS", viscosity, 12 cSt; 50-55% dimethylsiloxane; Aldrich) (1.3-2 w/v %). This solution is then mixed with a mesitylene solution of TFB (1.8 w/v %) to give a ratio of PDM-co-DPS-to-TFB ratio of 1-1.8, and spin-cast with control of temperature and phase-separation trajectory speed as described in Example 1. A bilayer structure of PDM-co-DPS-PMHS over TFB is obtained when optimised. The bilayer is then annealed at 210° C. for 2 min on a hotplate under nitrogen to effect crosslinking of the PDMS with the PMHS to give the crosslinked dielectric layer.

The invention claimed is:

1. A method of making a transistor having first and second electrodes, a semiconductive layer, and a dielectric layer; said semiconductive layer comprising a semiconductive polymer and said dielectric layer comprising an insulating polymer; characterised in that said method comprises the steps of:
   (i) depositing on the first electrode a layer of a solution, said solution comprising material for forming the semiconductive layer and material for forming the dielectric layer; and
   (ii) optionally curing the layer deposited in step (i);
   wherein, in step (i), the solvent drying time, the temperature of the first electrode and the weight ratio of (material for forming the dielectric layer): (material for forming the semiconductive layer) in the solution are selected so that the material for forming the semiconductive layer and the material for forming the dielectric layer phase separate by self-organisation to form an interface between the material for forming the semiconductive layer and the material for forming the dielectric layer; and
   wherein said solution comprises a diblock polymer, said diblock polymer comprising a semiconductive block for forming the semiconductive layer and a dielectric block for forming the dielectric layer.

2. A method according to claim 1, wherein the weight ratio of (material for forming the dielectric layer): (material for forming the semiconductive layer) is in the range of from 0.5 to 2.

3. A method according to claim 1, wherein the solvent drying time is in the range of from 0.1 to 100 s.

4. A method according to claim 1, wherein the material for forming the semiconductive layer comprises one or more aromatic or heteroaromatic structural units.

5. A method according to claim 4, wherein the one or more aromatic or heteroaromatic units independently are selected from the group consisting of fluorenedyil, phenylene, phenylene vinylene, triarylamine, thiophenediyl, thiophene, oxadiazole and benzothiadiazole.

6. A method according to claim 1, wherein the material for forming the dielectric layer comprises crosslinkable groups.

7. A method according to claim 1, wherein the material for forming the dielectric layer comprises one or more units having a low cohesive-energy density.

8. A method according to claim 7, wherein the one or more units having a low cohesive-energy density are selected from the group consisting of siloxane, perfluoroalkyl, perfluoroarylene ether, perfluoroalkylene ether.

9. A method according to claim 7, wherein the material for forming the dielectric layer has a surface tension in the range of from 15 to 35 dyn/cm.

10. A method according to claim 1, wherein the transistor is in top-gate configuration.

11. A method according to claim 1, wherein the transistor is in bottom-gate configuration.

12. A method according to claim 11, wherein the material for forming the dielectric layer comprises one or more units having high affinity for the first electrode.

13. A method according to claim 11, wherein the first electrode is surface treated prior to step (i) with a material containing one or more units having a high affinity for the first electrode.

14. A method according to claim 1, wherein the thickness of the dielectric layer is below 400 nm.

15. A method according to claim 1, wherein the thickness of the semiconductive layer is in the range of 10 nm to 300 nm.

16. A method according to claim 1, wherein the transistor is a field-effect transistor.

17. A method according to claim 1, wherein the transistor is a phototransistor.

18. A transistor obtainable by the method as defined in claim 1.

19. A method of making a transistor having first and second electrodes, a semiconductive layer, and a dielectric layer; said semiconductive layer comprising a semiconductive polymer and said dielectric layer comprising an insulating polymer; characterised in that said method comprises steps of:
   (i) depositing on the first electrode a layer of a solution, said solution comprising material for forming the semiconductive layer and material for forming the dielectric layer; and
   (ii) optionally curing the layer deposited in step (i);
   wherein, in step (i), the solvent drying time, the temperature of the first electrode and the weight ratio of (material for forming the dielectric layer): (material for forming the semiconductive layer) in the solution are selected so that the material for forming the semiconductive layer and the material for forming the dielectric layer phase separate by self-organization to form an interface between the material for forming the semiconductive layer and the material for forming the dielectric layer,
   wherein the material for forming the dielectric layer is mixed with the material for forming the semiconductive layer in the solution.

20. A method according to claim 19, wherein the material for forming the dielectric layer comprises oligomers and/or monomers for forming the insulating polymer and the material for forming the semiconductive layer comprises a semiconductive polymer and/or oligomers for forming the semiconductive polymer.

21. A method according to claim 19, wherein the material for forming the dielectric layer comprises an insulating polymer and the material for forming the semiconductive layer comprises a semiconductive polymer and/or oligomers for forming the semiconductive polymer.

22. A method of making an electric or optoelectronic device comprising a transistor made according to the method of claim 19.

23. A method according to claim 22, wherein the electronic or optoelectronic device comprises an RF tag, electronic paper, chemical sensor, logic circuit, amplifier, or driver circuit.

24. An electronic or optoelectronic device obtainable by the method as defined in claim 22.

* * * * *